(12) United States Patent
Van Dal et al.

(10) Patent No.: US 8,866,239 B2
(45) Date of Patent: Oct. 21, 2014

(54) IC MANUFACTURING METHOD, IC AND APPARATUS

(75) Inventors: Marcus Van Dal, Leuven (NL); Aurelie Humbert, Brussel (BE); Matthias Merz, Leuven (BE); Youri Victorovitch Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 227 days.

(21) Appl. No.: 13/289,063

(22) Filed: Nov. 4, 2011

(65) Prior Publication Data

US 2012/0112294 A1      May 10, 2012

(30) Foreign Application Priority Data

Nov. 5, 2010   (EP) ..................................... 10190268

(51) Int. Cl.
*H01L 27/14*   (2006.01)
*H01L 29/66*   (2006.01)
*H01L 23/34*   (2006.01)

(52) U.S. Cl.
USPC ............ 257/417; 257/414; 257/423; 257/713

(58) Field of Classification Search
USPC ......... 257/417, 773, 700, 782, 787, 723, 687, 257/423, 414, 713
See application file for complete search history.

(56) References Cited

U.S. PATENT DOCUMENTS

| 7,595,209 | B1 | 9/2009 | Monadgemi et al. |
| 2003/0148550 | A1* | 8/2003 | Volant et al. ..................... 438/52 |
| 2007/0249082 | A1 | 10/2007 | Hanaoka et al. |
| 2009/0290317 | A1* | 11/2009 | Mashino ....................... 361/782 |
| 2010/0075481 | A1 | 3/2010 | Yang |
| 2011/0012211 | A1 | 1/2011 | Merz et al. |
| 2011/0036913 | A1 | 2/2011 | Merz et al. |

FOREIGN PATENT DOCUMENTS

EP      2 275 384 A1    1/2011

OTHER PUBLICATIONS

Extended European Search Report for Patent Appln. No. 10190268.2 (May 20, 2011).

* cited by examiner

*Primary Examiner* — Chuong A. Luu (57) ABSTRACT

A method of manufacturing an integrated circuit having a substrate comprising a plurality of components and a metallization stack over the components, the metallization stack comprising a first sensing element and a second sensing element adjacent to the first sensing element.

8 Claims, 6 Drawing Sheets

IC MANUFACTURING METHOD, IC AND APPARATUS

CROSS-REFERENCE TO RELATED APPLICATIONS

This application claims the priority under 35 U.S.C. §119 of European patent application no. 10190268.2, filed on Nov. 5, 2010, the contents of which are incorporated by reference herein.

FIELD OF THE INVENTION

The present invention relates to a method of manufacturing an integrated circuit having a substrate comprising a plurality of components and a metallization stack over said components, the metallization stack comprising a first sensing element and a second sensing element adjacent to the first sensing element.

The present invention further relates to an integrated circuit comprising a substrate carrying a plurality of components and a metallization stack over said plurality of components, the metallization stack comprising a first sensing element and a second sensing element adjacent to the first sensing element.

The present invention yet further relates to an article comprising such an integrated circuit.

BACKGROUND OF THE INVENTION

Integrated circuit (IC) functionality is commonly extended with sensor functionality for a wide variety of reasons. For instance, sensor functionality may be included in the form of moisture sensors or shock sensors to determine if a field return of the IC is caused by misuse of the apparatus in which the IC was integrated. Such sensors are typically not used in normal operation of the IC. However, the IC may equally comprise one or more sensors that are part of the operational functionality of the IC, for instance to measure the presence and/or concentrations of one or more analytes in a medium to which the IC is exposed, e.g. a sample or the atmosphere into which the IC is placed. Such ICs find their application in medical diagnostics as well as in other application domains.

The IC may for instance comprise radio-frequency identification tag functionality, which is used to identify the exposure of a product to which the IC has been tagged to one or more environmental factors, which for instance can be used to aid the appropriate storage of the tagged product, e.g. in case of perishable products, to extend its shelf life.

It is known that sensing elements can be advantageously integrated into the back-end of an IC manufacturing process, e.g. by integration of the sensing element into the metallization stack of the IC. Such a metallization stack typically provides the necessary interconnections of circuit elements mounted on the substrate of the IC, e.g. transistors, as well as the interconnections between the circuit elements and the outside world.

One of the challenges IC designers are faced with when integrating multiple sensors into the metallization stack is that environmental sensors have to be in communicative contact with the environment. This however increases the risk that moisture penetrates the metallization stack and interferes with the correct operation of the underlying circuit elements of the IC. To this end, a moisture barrier layer such as a $Ta_2O_5$ layer or a passivation layer may be deposited over the metallization stack to protect the underlying circuitry from exposure to moisture. However, when integrating multiple sensors with different functionality in the metallization layer, the partial removal of such a barrier layer cannot always be avoided.

Figure 1:
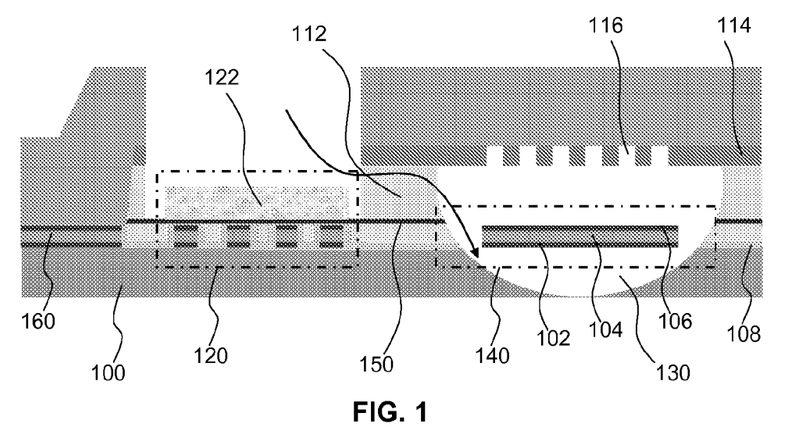
FIG. 1 schematically depicts a problem associated with prior art multi-sensor ICs.

An example of such a multi-sensor IC is shown in FIG. 1, in which an environmental sensor 120 having a transducer 122 and a shock sensor 140 are formed in a top metal layer of a metallization stack of the IC, the underlying layers of which are schematically depicted by a single layer 100 for the sake of clarity only. Such a top metallization layer may for instance comprise a stack of metal layers such as an AlCu layer 104 sandwiched between TiTiN layers 102 and 106. A bond pad 160 is also shown by way of example only.

Figure 2:
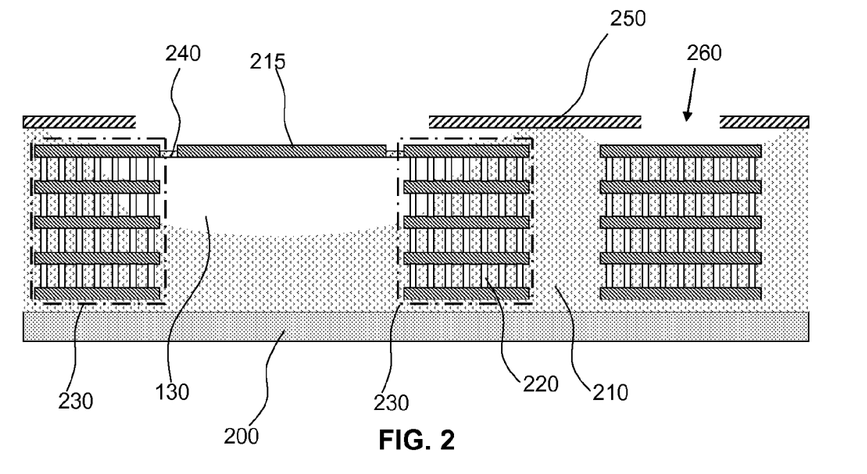
FIG. 2 schematically depicts a prior art IC comprising a shock sensor.

An example of a shock sensor as disclosed in unpublished European patent application 09165533.2 is shown in FIG. 2. The shown cross-section comprises structures for a shock sensor on the left and a conventional bond pad 260 on the right. The entire die is capped by layers of oxide and nitride, the so-called passivation stack 250 or scratch protection, which protects the chip from external influences such as mechanical damage, e.g. scratches. The shock sensor is implemented as an inertial mass element 215 suspended by conductive connecting portions 240, which are connected to support structures 230 to electrically connect the inertial mass element 215 to active circuitry of the IC.

The inertial mass element 215 may be formed as a patterned metal portion of the metallization stack, which comprises of patterned conductive (metal) layers separated by dielectric layers indicated by reference numeral 210, which each dielectric layer typically comprising one or more conductive vias 220 interconnecting portions of different conductive layers with each other.

The conductive connection portions 240 will have an elastic modulus defined by the materials chosen to form these portions, which for instance may be formed as part of the metal layer to which they belong. Because of this elastic modulus, the conductive connection portions 240 act as springs when the inertial mass element 215 is suspended in a fluid such as air. The conductive connection portions 240 may be recessed with respect to the surrounding metal layer. This may be achieved by subjecting these portions to an additional etching step during the formation of the metallization stack. For instance, in case of multi-layered conductive connection portions 240, the metal stack of the portions can be reduced, e.g. etching away the top TiN and AlCu metal layer, leaving only a Ti/TiN stack. An advantage of this approach is that such a thin stack breaks more easily compared to a metal stack having its full thickness, thus allowing a reduction of the size of the inertial mass to achieve the same detection characteristics, i.e. the detection of the same acceleration force threshold being exceeded, which translates to a reduction in overall sensor size and cost.

Alternatively, the conductive connection portions 240 may consist of relatively narrow lines involving the same metal stack as the inertial mass element 215. In this embodiment, the entire shock sensor can be fully realized using conventional metallization stack processing followed by one additional process step.

In order to create a void or cavity 130 around the inertial mass element 104, the passivation layer 250 including the moisture-impenetrable layer 150 shown in FIG. 1 is removed from over the inertial mass element 215 by means of a conventional passivation etch, e.g. a bond pad opening etch. Openings are shown over the inertial mass element 215 and the bond pad 260. The etchant is selected such that it removes the dielectric materials but does not attack the conductive structures including inertial mass element 215 and the conductive connection portions 240, resulting in a 'free floating' inertial mass element 215 being obtained.

Now, returning to FIG. 1, a passivation stack comprising a moisture-impenetrable layer 150 such as a $Ta_2O_5$ layer, an oxide layer 112 and a nitride layer 114 covers the IC and protects it from damage, e.g. from moisture penetrating the IC and interfering with the correct operation of the active circuitry. However, the consequence of the formation of the cavity 130 in which the sensor 140 is placed means that the a moisture-impenetrable layer 150 has been disrupted, as such cavities are typically formed by providing a number of openings 116 in the nitride layer 114 above the sensor 140 and etching away the oxide 112 as well as the moisture-impenetrable layer 150 surrounding the sensor 140 to form the cavity 130.

Consequently, as the environmental sensor 120 has to be exposed to the environment, i.e. by opening the passivation stack above the transducer 122, a path exists for moisture to penetrate the IC through this opening, the relatively porous oxide layer 112 exposed in this opening and the cavity 130, as indicated by the arrow in FIG. 1. This is of course unwanted as such moisture penetration can detrimentally affect the operation of the IC as previously explained.

SUMMARY OF THE INVENTION

The present invention seeks to provide a method of manufacturing such a multi-sensor IC in which the risk of moisture penetration into the metallization stack and active circuitry is reduced.

The present invention further seeks to provide a multi-sensor IC that is less prone to moisture damage.

The present invention yet further seeks to provide an article comprising such an IC.

In accordance with an aspect of the present invention, there is provided a method of manufacturing an integrated circuit having a substrate comprising a plurality of components and a metallization stack over said components, the metallization stack comprising a first sensing element and a second sensing element adjacent to the first sensing element, the method comprising depositing a moisture-impenetrable layer over the metallization stack; depositing a passivation layer over the moisture-impenetrable layer; patterning the passivation layer and underlying moisture-impenetrable layer such that a trench is formed surrounding a region of the passivation layer over the first or second sensing element, the depth of said trench extending to a portion of the metallization stack; depositing a layer of a further moisture-impenetrable material over the resultant structure thereby filling said trench; patterning said further moisture-impenetrable material to expose a portion of the passivation layer in a region above the first sensing element; and removing the exposed portion of the passivation layer to expose the first sensing element.

This has the advantage that the moisture-impenetrable layer over the metallization stack and the guard ring surrounding the second sensing element effectively provide a moisture barrier protecting the internals of the IC against moisture penetrating through parts of the passivation stack exposed to the environment by the opening above the first sensing element. Consequently, the IC is effectively protected against moisture penetration if the moisture-impenetrable layer over the metallization stack has to be disrupted, e.g. for suspending the second sensing element in a cavity (partially) formed in the metallization stack.

Advantageously, the further moisture-impenetrable material comprises Al as Al can be routinely used in IC manufacturing processes and therefore does not require costly redesign of the manufacturing process.

In an embodiment, the metallization stack comprises a plurality of patterned metal layers separated by respective dielectric layers, and wherein the method further comprises exposing the passivation layer in a region over the second sensing element; patterning the passivation layer in the region over the second sensing element to provide a plurality of etch openings; etching at least some of the dielectric material surrounding the second sensing element through said plurality of etch openings to define a cavity surrounding the second sensing element; and filling the region over the second sensing element with the further moisture-impenetrable material. This ensures that in case a cavity needs to be formed around the second sensing element, this cavity is effectively protected from being exposed to moisture the guard ring and a lid of the further moisture-impenetrable material over the guard ring.

In an embodiment, the step of filling the region over the second sensing element comprises depositing a further layer of the further moisture-impenetrable material over the resultant structure; and patterning said further layer to expose the portion of the passivation layer in a region above the first sensing element. This has the advantage that the moisture protection over the second sensing and the opening the first sensing element in a minimal number of process steps.

In another embodiment, the second sensing element comprises a first conductive support structure, a second conductive support structure and an inertial mass element comprising at least one metal portion conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions. Such a shock sensor can be advantageously used to detect exposure of the IC to excessive shocks by detecting if the at least one of said conductive connection portions has broken, which may be achieved by measuring the resistance or conductivity of the conductive path formed by the first conductive support structure, the second conductive support structure, the inertial mass element and the respective conductive connection portions.

In accordance with another aspect of the present invention, there is provided an integrated circuit comprising a substrate carrying a plurality of components and a metallization stack over said plurality of components, the metallization stack comprising an first sensing element and a second sensing element adjacent to the first sensing element, the integrated circuit further comprising a patterned moisture-impenetrable layer over the metallization stack and a patterned passivation layer over the moisture-impenetrable layer, said patterned passivation layer comprising a void exposing the first sensing element; and a trench filled with a further moisture-impenetrable material to define a guard ring delimiting a region over the first or second sensing element, said guard ring extending through the passivation layer and the underlying moisture-impenetrable layer to a portion of the metallization stack. Such an IC has the advantage that moisture cannot easily penetrate the IC through the void above the first sensing element due to the moisture barrier formed by the patterned moisture-impenetrable layer and the moisture-impenetrable guard ring.

The further moisture-impenetrable material may further cover the region over the second sensing element to further protect the IC from exposure to moisture via the second sensing element.

Preferably, the further moisture-impenetrable material comprises Al as this reduces the cost of the IC due to the fact that Al is readily available in most process technologies for manufacturing the IC, thus not requiring costly redesign of the manufacturing process.

The metallization stack may comprise a plurality of patterned metal layers separated by respective dielectric layers second sensing element is located in a cavity formed by the partial removal of the dielectric layers. The present invention is particularly but not exclusively suited for protecting ICs comprising sensors such as shock sensors or MEMS sensors in a cavity in the metallization stack, as the formation of the cavity typically requires the patterning, i.e. disruption of the moisture-impenetrable layer over the metallization stack.

In an embodiment, the second sensing element comprises a first conductive support structure and a second conductive support structure; and an inertial mass element comprising at least one metal portion conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions. Such a shock sensor can be advantageously used to detect exposure of the IC to excessive force as previously explained.

In an embodiment, the first sensing element is a pH sensor or a gas sensor. Such environmental sensors can be advantageously used to monitor the environment to which the IC is exposed. This is for instance particularly useful for RFID ICs, where the monitoring of the environmental conditions can provide valuable information about storage conditions of an article to which the IC has been attached.

In accordance with yet another aspect of the present invention there is provided an article comprising the integrated circuit of the present invention. Such an article may be an apparatus relying on the functionality of the IC to define a part of the functionality of the apparatus or a product tagged with the IC for identification purposes, e.g. via RF communication.

BRIEF DESCRIPTION OF THE EMBODIMENTS

Embodiments of the invention are described in more detail and by way of non-limiting examples with reference to the accompanying drawings, wherein.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 3:
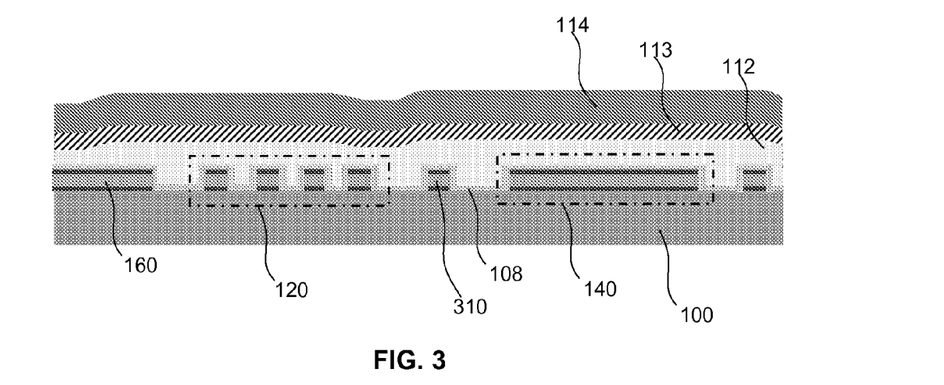
FIG. 3-12 schematically depict various steps of an embodiment of the method of the present invention.

FIG. 3 shows the starting point of an embodiment of the present invention, in which a substrate is provided onto which components such as active circuits are formed (not shown), which are interconnected by a metallization stack, the lower layers of which are schematically represented by single structure 100. The substrate, its components and the metallization stack may be formed in any suitable manner. The exact composition of the materials used to form the metallization stack is not relevant to the present invention; any suitable materials may be used.

The top layer of the metallization stack comprises a first sensing element 120, which typically is an environmental sensor element such as a gas sensor, pH sensor or moisture sensor, and a second sensing element 140, which typically is an internal sensor element such as a shock sensor to detect misuse of the integrated circuit. The second sensing element 140 is located adjacent, i.e. laterally displaced in respect, to the first sensing element 120. A bond pad 160 may also be present in the top layer of the metallization stack.

Figure 4:
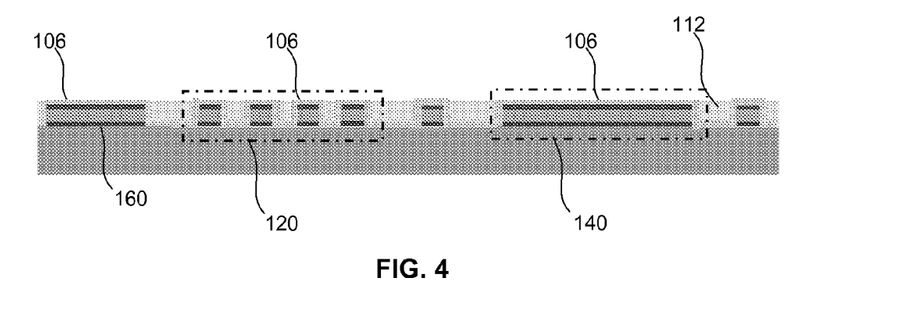

A protective liner 108 such as a SiON liner may be formed over the top layer of the metallization stack, after which a passivation layer stack formed of one or more oxide layers (two layers 112 and 113 are shown by way of non-limiting example) and a nitride layer 114 are formed over the protective liner 108. The passivation stack is planarized as shown in FIG. 4 in any suitable way, e.g. by chemical mechanical polishing (CMP) to finalize the back end processing of the metallization stack, i.e. to fill the gaps between the patterned top metal layer defining the first sensing element 120, the second sensing element 140 and one or more bond pads 160 with a dielectric material 112 such as silicon oxide ($SiO_2$). At this stage it is noted that the top metallization layer further comprises a metal ring 310 electrically insulated from and surrounding the second sensing element 140, which purpose will be explained in more detail later.

Figure 5:
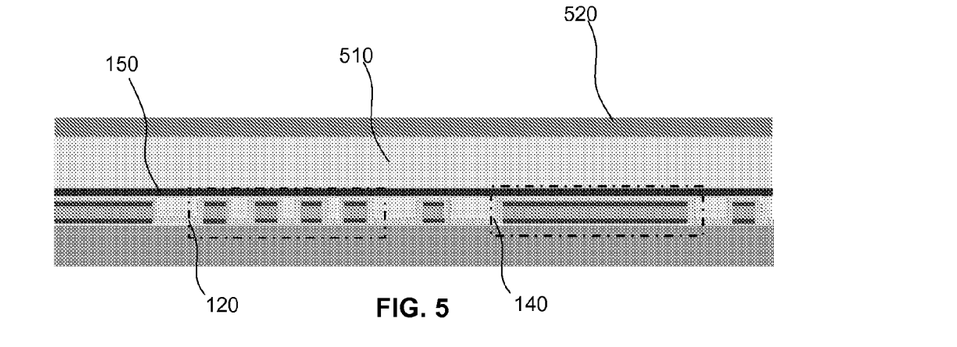

In a next step, shown in FIG. 5, a layer stack is formed over the metallization stack including the first sensing element 120, the second sensing element 140, the bond pad(s) 160 and the ring structure 130. The layer stack comprises a moisture-impenetrable layer 150 and a passivation stack, which may have any suitable composition, such as a two-layer stack including a dielectric layer 510 and a scratch protection layer 520. In a preferred embodiment, the moisture-impenetrable layer 150 comprises tantalum oxide ($Ta_2O_5$) because this material not only is water-tight but also is pH-sensitive, such that it may double as a functional layer on the surface of the first sensing element 120. Alternatively, the moisture-impenetrable layer 150 may form part of the passivation stack. The dielectric layer 510 may for instance be a $SiO_2$ layer and the scratch protection layer may be a $Si_3N_4$ layer. It is well-known to the skilled person how such layers may be formed such that this will not be explained in more detail for reasons of brevity only.

Figure 6:
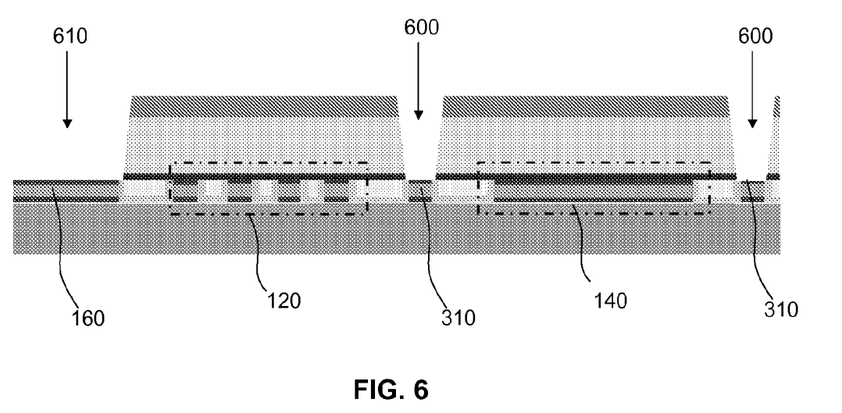

Next, the layer stack deposited as shown in FIG. 5 is patterned as shown in FIG. 6 to expose the bond pad(s) 160 and the metal ring structure 130 in the top metallization layer. This may for instance be achieved by an etching step. Suitable etch recipes will be known to the skilled person. The selective etching may be achieved in any suitable manner, e.g. by use of an appropriately patterned hard mask that is stripped away after completion of the etch step. This is not explicitly shown. The result of the etching step is the formation of a trench 600 over the metal ring structure 310 and further trench(es) 610 exposing the metal of the bond pad(s) 160.

Figure 7:
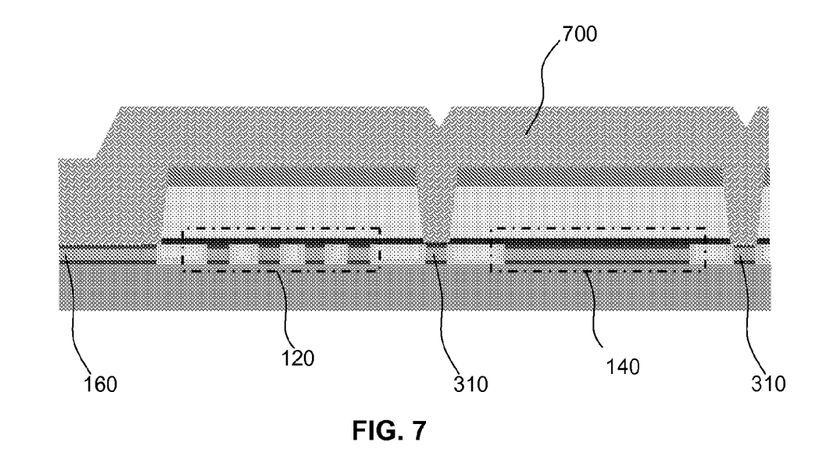

In a preferred embodiment, the trench 610 and one or more further trenches 610 are filled with a material 700 that can act both as a conductive interconnect for the bond pads 160 and as a further moisture-impenetrable material. An example of such a material is Al. This is shown in FIG. 7. Variations to this embodiment will be apparent to the skilled person; it is for instance also possible to fill the trench 600 with a further moisture-impenetrable and the one or more trenches 610 with a different material, as the required function of these materials is different. Nevertheless, from a process efficiency (i.e. cost) perspective, it is preferable that trenches 600 and 610 are filled in a single deposition step.

Figure 8:
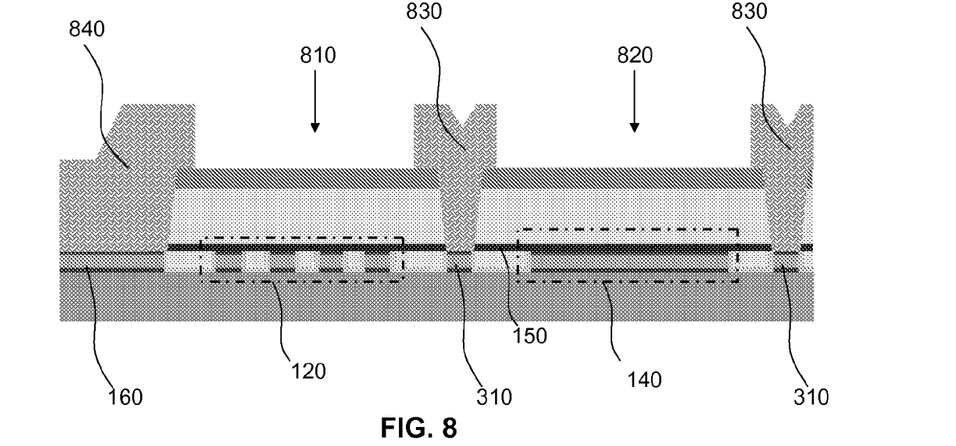

In FIG. 8, the material 700 is patterned, e.g. by etching, to expose the region 810 of the passivation layer stack over the first sensing element 120 and the region 820 of the passivation layer stack over the second sensing element 140, as well as to define a guard ring 830 of the further moisture-impenetrable material 700 over the metal ring portion 310 and one or more bond pad contacts 840 over the respective bond pads 160. As can be seen in FIG. 8, as the guard ring 130 joins with the layer 150 of the first moisture-impenetrable material, e.g. $Ta_2O_5$, the resulting structure provides a moisture barrier for any moisture entering the passivation stack exposed over the first sensing element 120, as will be explained in more detail later. In an alternative embodiment, only the region 820 of the passivation stack is exposed, i.e. only a single opening is created in the layer 700 of the further moisture-impenetrable material.

Figure 9:
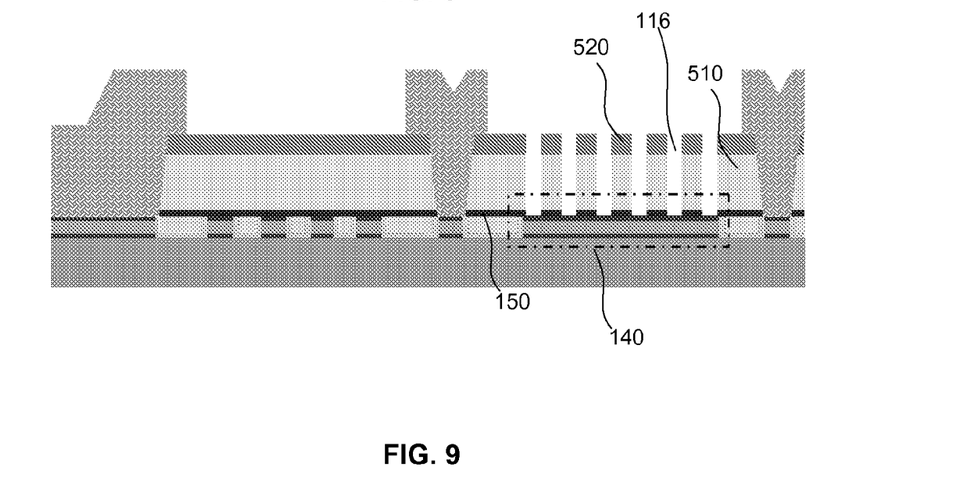

In case the second sensing element is to be suspended in a cavity, the method of the present invention may proceed as shown in FIG. 9, by providing a number of openings, e.g. slits, in the region 820 of the passivation layer stack above the second sensing element 140. The openings extend to the top metallization layer, i.e. extend through the scratch protection layer 520, dielectric layer 510 and the moisture-impenetrable material layer 150. The openings 116 facilitate the formation of a cavity around the second sensing element 140 such as the shock sensor as shown in FIG. 2. The cavity may be formed by any suitable etching step although alternative embodiments are equally feasible; for instance, the second sensing element 140 may be embedded in a thermally decomposable polymer such as polynorbornene, with the openings 116 acting as chimneys to let the degradation products escape from the metallization stack following heating the TDP to above its decomposition temperature.

Figure 10:
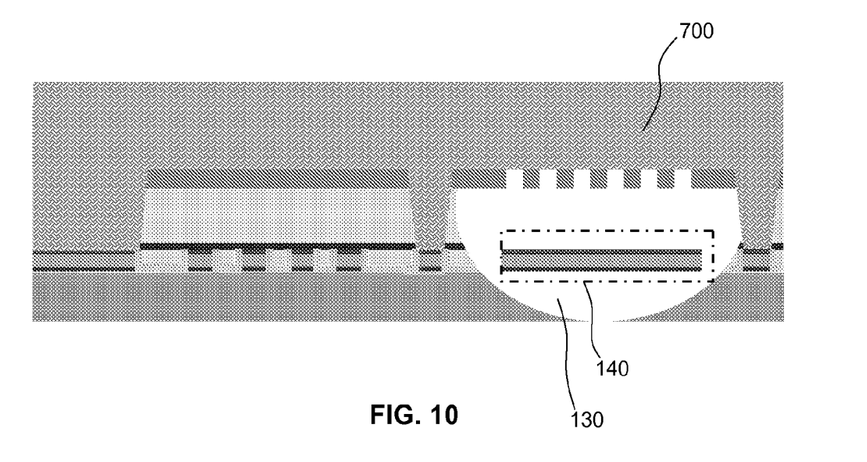

The resulting cavity 130 is shown in FIG. 10. After formation of the cavity 130, the opening 820 and the opening 810 are filled again with the further moisture-impenetrable material 700. Alternatively, only the opening 820 is filled again. It is reiterated that in an alternative embodiment, the opening 810 did not require to be formed in the step shown in FIG. 8.

Figure 11:
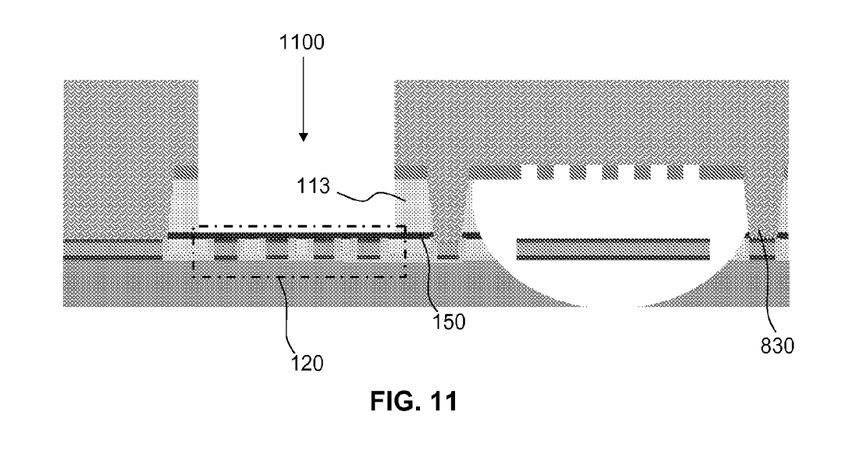

The formation of the IC of the present invention may now be completed by opening the passivation layer stack above the first sensing element 120 to expose the first sensing element 120. This is shown in FIG. 11, where a recess 1100 is formed above the first sensing element 120 by the selective removal of the further moisture-impenetrable material 700 and the passivation layer stack. If necessary, the first sensing element 120 may now be further functionalized, e.g. by the formation of a transducer 122 on the top metallization layer portion of the first sensing element 120, as shown in FIG. 12.

Figure 12:
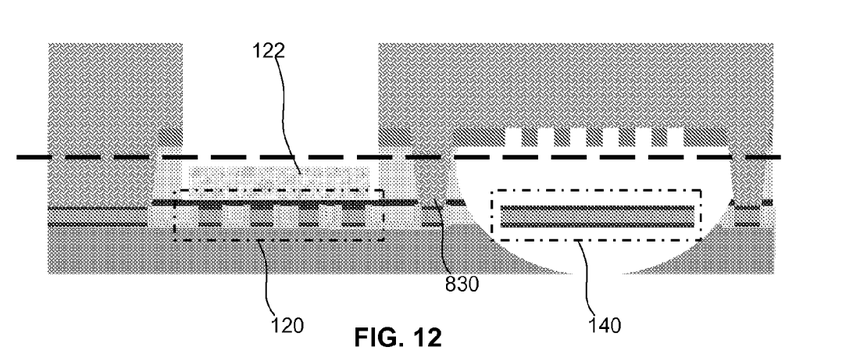

As can be seen in FIGS. 11 and 12, the portion of the passivation layer stack that is exposed inside the recess 1100, i.e. that forms part of the side walls of recess 1100, and in particular the relatively porous dielectric layer 113, is insulated from the internals of the IC in a water-tight manner by the first moisture-impenetrable layer 150 underneath the relatively porous dielectric layer 113 and by the moisture-impenetrable guard ring 830 adjacent to the porous dielectric layer 113. The guard ring 830 prevents moisture penetrating the relatively porous dielectric layer 113 from reaching the cavity 130 and thus finding a route to the components, e.g. active circuits such as transistors, on the substrate or even into the metallization stack where the moisture could lead to short circuits between conductive portions intended to be electrically insulated from each other.

Figure 13:
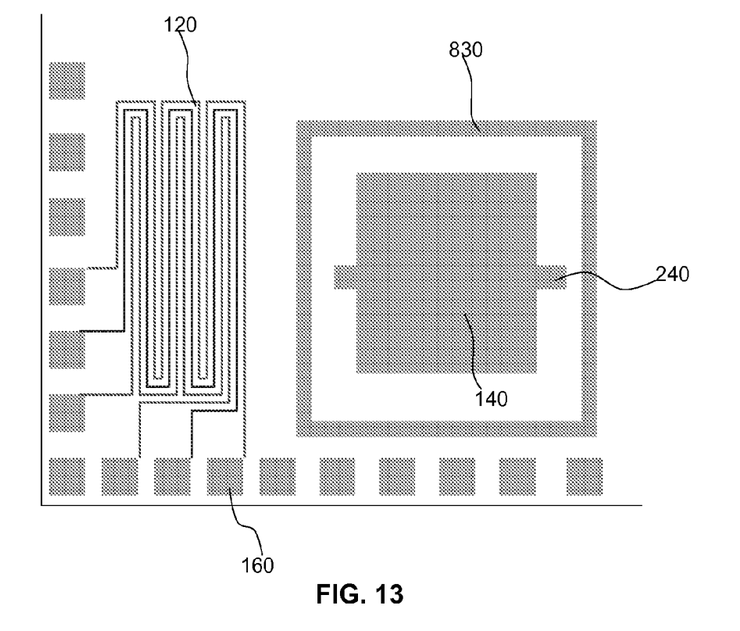
FIG. 13 schematically depicts a top view of an embodiment of an IC of the present invention.

FIG. 13 shows a top view of an embodiment of the IC of the present invention along the dashed line shown in FIG. 12. It can be seen how the second sensing element 140, e.g. a shock sensor having an inertial mass element 215 attached to support structures (not shown) by conductive connection portions 240 is insulated from the first sensing element 120 by the moisture-impenetrable guard ring 830 that surrounds the second sensing element 140. The transducer of the first sensing element 120 may be connected to one or more of the bond pads 160 as shown in FIG. 13.

At this stage it is noted that although in the above described example embodiment of the present invention the moisture-impenetrable guard ring 830 is shown to surround the second sensing element 140, it is equally feasible to protect the second sensing element 140 from exposure to moisture entering the IC through the recess 1100 by providing a moisture-impenetrable guard ring 830 that instead or in addition surrounds the first sensing element 120, as this also ensures that any moisture penetrating the IC through the recess 1100 is prevented from progressing into the metallization stack by the first moisture-impenetrable layer 150 underneath the relatively porous dielectric layer 113 and by the moisture-impenetrable guard ring 830 adjacent to the porous dielectric layer 113. In this case, the portion 310 of the patterned metallization layer will surround the first sensing element 120 instead of the second sensing element 140.

It is further noted that the order of steps of the embodiment of the method of the present invention as described above may be altered where possible without departing from the teachings of the present invention.

Finally, it is reiterated that although the present invention has been described using an environmental sensing element 120 and a shock sensing element 140 as examples, the present invention is applicable to any IC having multiple sensors in the metallization stack where some but not all of the sensors require environmental exposure, and where the disruption of the first moisture-impenetrable layer 150 cannot be avoided in the formation of at least one of the sensing elements that do not require exposure to the environment of the IC.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising a substrate carrying a plurality of components and a metallization stack over said plurality of components, the metallization stack comprising a first sensing element and a second sensing element adjacent to the first sensing element, the integrated circuit further comprising a patterned moisture-impenetrable layer over the metallization stack and a patterned passivation layer over the moisture-impenetrable layer, said patterned passivation layer comprising:

a void exposing the first sensing element; and a trench filled with a further moisture-impenetrable material to define a guard ring delimiting a region over the first or second sensing element, said guard ring extending through the passivation layer and the underlying moisture-impenetrable layer to a portion of the metallization stack.

2. The integrated circuit of claim 1, wherein said further moisture-impenetrable material further covers the region over the second sensing element.

3. The integrated circuit of claim 1, wherein the further moisture-impenetrable material comprises Al.

4. The integrated circuit of claim 1, wherein the metallization stack comprises a plurality of patterned metal layers separated by respective dielectric layers, and wherein the second sensing element is located in a cavity formed by the partial removal of the dielectric layers.

5. The integrated circuit of claim 4, wherein the second sensing element comprises:

first and second conductive support structures; and an inertial mass element comprising at least one metal portion conductively coupled to the first support structure and the second support structure by respective conductive connection portions, at least one of said conductive connection portions being designed to break upon the inertial mass element being exposed to an acceleration force exceeding a threshold defined by the dimensions of the conductive connection portions.

6. The integrated circuit of claim 1, wherein the first sensing element comprises a transducer.

7. The integrated circuit of claim 6, wherein the first sensing element is a pH sensor or a gas sensor.

8. An article comprising the integrated circuit of claim 1.

* * * * *